United States Patent [19]
Sato et al.

[11] Patent Number: 6,072,736
[45] Date of Patent: Jun. 6, 2000

[54] SEMICONDUCTOR MEMORY DEVICE

[75] Inventors: Kenji Sato; Yuichi Matsushita, both of Miyazaki, Japan

[73] Assignee: Oki Electric Industry Co., Ltd., Tokyo, Japan

[21] Appl. No.: 09/418,021

[22] Filed: Oct. 14, 1999

[30] Foreign Application Priority Data

Nov. 10, 1998 [JP] Japan .................................. 10-319587

[51] Int. Cl.[7] .................................................... G11C 7/00
[52] U.S. Cl. .................. 365/200; 365/225.7; 365/230.03
[58] Field of Search .............................. 365/200, 230.03, 365/225.7

[56] References Cited

U.S. PATENT DOCUMENTS 5,907,511   5/1999   Crafts ...................................... 365/200

FOREIGN PATENT DOCUMENTS

| 1-189099 | 7/1989 | Japan . |
| 3-58398 | 3/1991 | Japan . |
| 5-47196 | 2/1993 | Japan . |
| 9-237496 | 9/1997 | Japan . |

*Primary Examiner*—Vu A. Le
*Attorney, Agent, or Firm*—Jones Volentine, LLP

[57] ABSTRACT

There is provided a semiconductor memory device 100 comprising memory cell blocks 20-1 to 20-n, decoder circuits 10-1 to 10-n that carry out the redundant operation provided so as to correspond to each memory cell block, a Roll Call signal transmission circuit 110 which detect if the redundant function is in operation; wherein each decoder circuit outputs a decoder signal FCi at low level to the Roll Call signal transmission circuit when the redundant function is in operation, but outputs a decoder signal at high level when the redundant function is not in operation, and wherein the Roll Call signal transmission circuit outputs a judgment signal at high level when all the decoder signals are at high level, but outputs a low level judgment signal when any of the decoder signals is at low level.

8 Claims, 15 Drawing Sheets

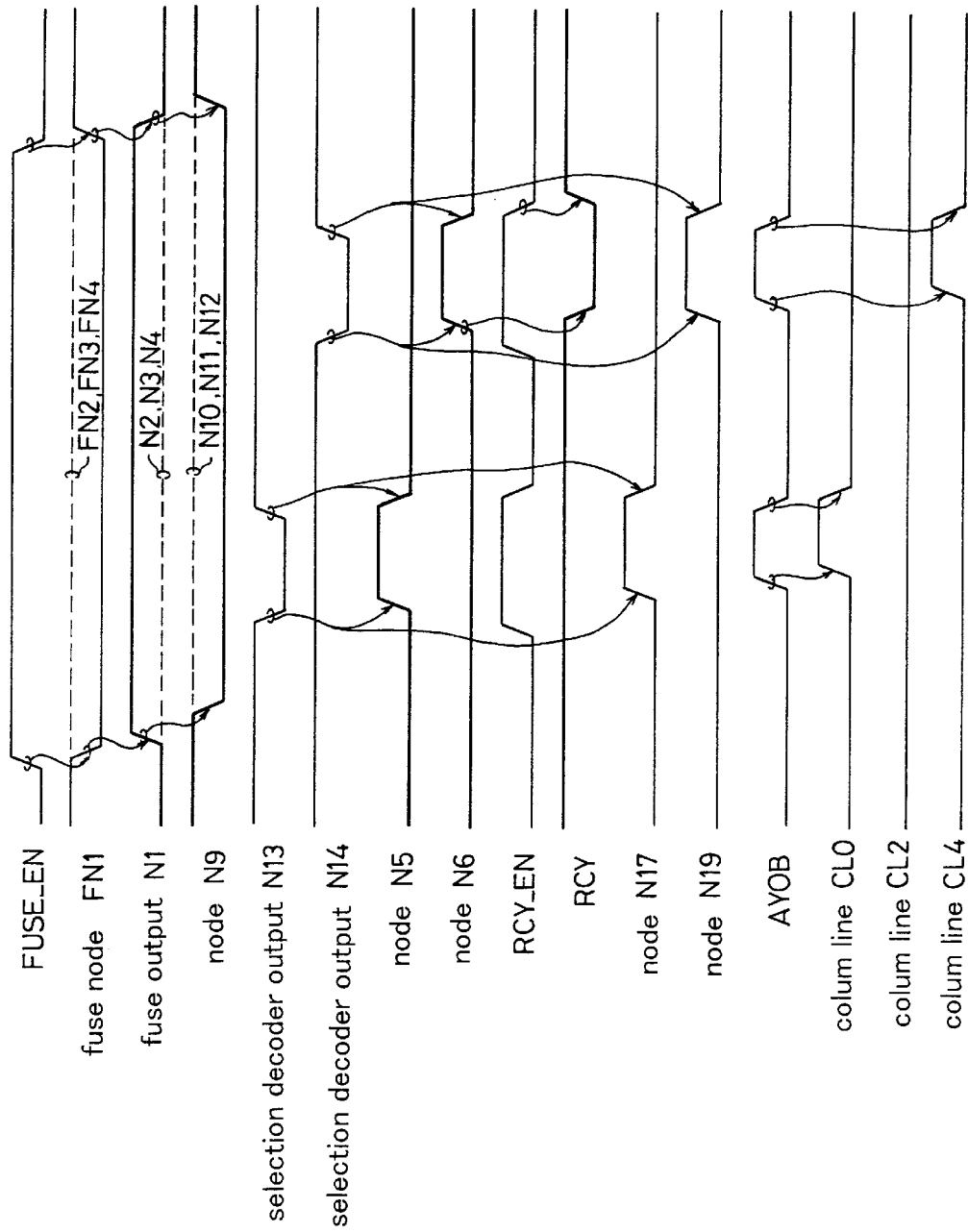

6,072,736

SEMICONDUCTOR MEMORY DEVICE

BACKGROUND OF THE INVENTION

The present invention relates to a semiconductor memory device, in particular, a semiconductor memory device which is provided with a Roll Call circuit, for example in a shifting type redundant circuit, for determining if a redundant function is in operation.

As a semiconductor memory has grown in size in recent years, a memory device provided with redundant memory cells in addition to normal memory cells is widely employed so that the redundant memory cells can replace with defective memory cells in a regular memory cell array so as to avoid a chip to become defective. As a redundant circuit to replace a defective memory cell with a redundant memory cell, a shifting type redundant circuit in which the defective memory cell and its succeeding memory cells are sequentially shifted is commonly used.

A decoder circuit 9 in a general purpose DRAM is explained in the following as an example of a shifting type redundant circuit in the prior art with reference to FIGS. 12 to 15. As shown in FIG. 12, the decoder circuit 9 includes a redundant fuse 1, a Roll Call circuit 2, a column decoder 3, a column decoder switching circuit 4 and a column driver 5.

The redundant fuse 1 comprises a fuse wiring FL on which fuses F1 to F4 capable to be cut off are connected in series, a fuse driver 6 connected with one end of the fuse wiring FL for transmitting a signal to the fuse wiring FL, a fuse clamp 7 connected with the other end of the fuse wiring FL for preserving electric potential of the fuse wiring FL, and inverters INV1 to INV4.

The input of the inverter INV1 is a fuse node FN1 while the output thereof is a node N1, both of which are positioned between the fuse F1 and the fuse F2. The input of the inverter INV2 is a fuse node FN2 while the output thereof is a node N2, both of which are positioned between the fuse F2 and the fuse F3. The input of the inverter INV3 is a fuse node FN3 while the output thereof is a node N3, both of which are positioned between the fuse F3 and the fuse F4. The input of the inverter INV4 is a fuse node FN4 while the output thereof is a node N4, both of which are positioned between the fuse F4 and the fuse clump 7. The outputs from the output nodes N1 to N4 of the inverters INV1 to INV4 are transmitted as the outputs from the redundant fuse 1. Output from the redundant fuse 1 is input to the Roll Call circuit 2 and the column decoder switching circuit 4.

As shown in FIG. 14, the fuse clump 7 comprises a P-channel MOS transistor (hereinafter referred to as "PMOS") 7a connected with a power source, a PMOS 7b and an inverter 7c. When an enable signal FUSE-EN is at low level, the PMOS 7a is on, whereas when the enable signal FUSE-EN is at high level, the PMOS 7b is turned on through the inverter 7c so as to preserve the fuse wiring FL at high level.

The Roll Call circuit 2 is provided for the purpose of detecting if the redundant function is in operation. The Roll Call circuit 2 includes a wiring FL2 outputting the output RCY of the Roll Call circuit 2, inverters INV21 to INV24, inputs of which are the output nodes N1 to N4 of the redundant fuse 1, respectively, Nch transistors NT3, NT6 NT9 and NT12, inputs of which are the output nodes N9 to N12 of the inverters INV21 to INV24, respectively, a Nch transistor NT2 connected with the power source, Nch transistors NT5, NT8 and NT11, input of which are the output nodes N1 to N3, respectively, inverters INV25 to INV28, inputs of which are the output nodes N13 to N16 of NAND elements NAND 13 to NAND 16 of the column decoder 3, Nch transistors NT1, NT4, NT7 and NT10, inputs of which are the output nodes N5 to N8 of the inverters INV25 to INV28, a Roll Call clump circuit 8 for preserving the electric potential of the output RCY. The Nch transistors NT1 to NT3, NT4 to NT6, NT7 to NT9 and NT10 to NT12 are connected in series by threes. The nodes at one end are connected to GND, while the nodes at the other ends are connected with the output RCY.

As shown in FIG. 15, the Roll Call clump 8 includes a P-channel MOS transistor 8a connected to the power source, PMOS 8b, and an inverter 8c. When an enable signal RCY-EN is at low level, the PMOS 8a is on, whereas when the enable signal RCY-EN is at high level, the PMOS 8b is turned on through the inverter 8c so as to preserve the fuse wiring FL2 at high level.

The column decoder 3 comprises the NAND elements NAND 13 to NAND 16 for decoding column addresses. As mentioned above, the outputs from the NAND elements NAND 13 to NAND 16 are input to the Roll Call circuit 2, more precisely, to the Nch transistors NT1, NT4, NT7 and NT10 through the inverter elements INV25 to INV28. Furthermore, the outputs from the NAND elements NAND 13 to NAND 16 are input to the column decoder switching circuit 4, which will be explained below.

The column decoder switching circuit 4 comprises transfer gate T1 to T8 and inverters INV5 to INV8 for switching the direction of the outputs from the column decoder 3 by means of the output nodes N1 to N4 of the redundant fuse 1, and inverters INV9 to INV13 positioned on the wiring which output signs transmitted through the transfer gates T1 to T8 to the column driver 5.

If the node N1, which is the output of the redundant fuse 1 is at high level, the selection decoder output node N13 of the NAND element NAND 13 in the column decoder 3 is output to the node N17 through the transfer gate T1 and inverter INV9 by turning on the transfer gate T1. On the contrary, if the node N1 is at low level, the selection decoder output node N13 is output to the node N18 through the transfer gate T2 and inverter INV10 by turning on the transfer gate T2 through the inverter INV5.

Similarly, if the node N2, which is the output of the redundant fuse 1 is at high level, the selection decoder output node N14 of the NAND element NAND 14 is output to the node N18 through the transfer gate T3 and inverter INV10 by turning on the transfer gate T3. On the contrary, if the node N2 is at low level, the selection decoder output node N14 is output to the node N19 through the transfer gate T4 and inverter INV11 by turning on the transfer gate T4 through the inverter INV6.

If the node N3, which is the output of the redundant fuse 1 is at high level, the selection decoder output node N15 of the NAND element NAND 15 is output to the node N19 through the transfer gate T5 and inverter INV11 by turning on the transfer gate T5. On the contrary, if the node N3 is at low level, the selection decoder output node N15 is output to the node N20 through the transfer gate T6 and inverter INV12 by turning on the transfer gate T6 through the inverter INV7.

If the node N4, which is the output of the redundant fuse 1 is at high level, the selection decoder output node N16 of the NAND element NAND 16 is output to the node N20 through the transfer gate T7 and inverter INV12 by turning on the transfer gate T7. On the contrary, if the node N4 is at low level, the selection decoder output node N16 is output to the node N21 through the transfer gate T8 and inverter INV13 by turning on the transfer gate T8 through the inverter INV8. As the outputs from the column decoder switching circuit 4, the output from the nodes N17 to N21 of the inverters INV9 to INV13 are input to the column driver 5.

The column driver 5 comprises NAND elements NAND 51 to NAND 60 for conducting final decoding based on outputs from the decoders transmitted from the column decoder switching circuit 4, and inverters INV51 to INV60 for driving column lines. Due to the heavy load of the wiring capacity, generally, the column lines can not be driven directly by the output from the decoder so that the NAND elements NAND 51 to NAND 60 and the inverters INV51 to INV60 are provided as the column drivers to receive the output from the decoder and drive the column lines.

When the output node N17 in the column decoder switching circuit 4 is at high level, and a column address AY0B is also at high level, the NAND element NAND 51 is turned to low level, and a normal column line CL0 is driven by the inverter INV51. On the other hand, when a column address AY0 is at high level, the NAND element NAND 52 is turned to low level, and a normal column line CL1 is driven by the inverter INV52.

Similarly, when the output node N18 in the column decoder switching circuit 4 is at high level, and a column address AY0B is also at high level, the NAND element NAND 53 is turned to low level, and a normal column line CL2 is driven by the inverter INV53. On the other hand, when a column address AY0 is at high level, the NAND element NAND 54 is turned to low level, and a normal column line CL3 is driven by the inverter INV54.

When the output node N19 in the column decoder switching circuit 4 is at high level, and a column address AY0B is also at high level, the NAND element NAND 55 is turned to low level, and a normal column line CL4 is driven by the inverter INV55. On the other hand, when a column address AY0 is at high level, the NAND element NAND 56 is turned to low level, and a normal column line CL5 is driven by the inverter INV56.

When the output node N20 in the column decoder switching circuit 4 is at high level, and a column address AY0B is also at high level, the NAND element NAND 57 is turned to low level, and a normal column line CL6 is driven by the inverter INV57. On the other hand, when a column address AY0 is at high level, the NAND element NAND 58 is turned to low level, and a normal column line CL7 is driven by the inverter INV58.

When the output node N21 in the column decoder switching circuit 4 is at high level, and a column address AY0B is also at high level, the NAND element NAND 59 is turned to low level, and a redundant column line RCL0 is driven by the inverter INV59. On the other hand, when a column address AY0 is at high level, the NAND element NAND 60 is turned to low level, and a redundant column line RCL1 is driven by the inverter INV60.

The circuit structure of a semiconductor memory device 500 provided with the decoder circuit 9 is explained in the following with reference to the FIG. 13. The decoder circuits 9 are provided so as to correspond to with a memory cell blocks 20 with redundant function. The outputs RCY of the Roll Call circuits 2 in each decoder circuit 9 are connected in series.

Next, the operation of the semiconductor memory device 500 in the prior art is explained with reference to FIG. 16. First, the operation in case that the fuses are not cut off, in other words, the redundant column lines RCL0, RCL1 are not used, is explained with reference to FIG. 16.

When the fuse enable signal FUSE-EN for enabling the column decoder to be ready for operation is switched from low to high level, the fuse nodes FN1 to FN4 on the fuse wiring FL are switched from high to low level. Further, the nodes N1 to N4 which are the outputs of the redundant fuse 1 are turned from low to high level by means of the inverters INV1 to INV4. Consequently, the transfer gates T1, T3, T5 and T7 among the transfer gates provided in the column decoder switching circuit 4 are turned on. It is to be noted that in this specification, the transfer gates T1, T3, T5 and T7, which are turned on by switching the nodes N1 to N4 to high level are referred to as "the upper transfer gates", whereas the transfer gates T2, T4, T6 and T8, which are turned on by switching the nodes N1 to N4 to low level are referred to as "the lower transfer gates".

If the output node N13 of the column decoder is selected by the column decoder and turned to low level after the upper transfer gates T1, T3, T5 and T7 are turned on, the node N17 is turned to high level through the transfer gate T1. Next, with the column address AY0B turned to high level, the column line CL0 is switched from low to high level. Similarly, as the nodes N18 to N20 are turned to high level, but the node N21 is not turned to high level in case that the fuses are not cut off, only the normal column lines CL0 to CL7 are used.

Next, the operation in case that the redundant column lines are used is explained with reference to FIG. 17. Here, the operation in case that the fuse F2 is cut off is explained as an example. When the fuse enable signal FUSE-EN is switched from low to high level, the fuse nodes FN1 is turned to low level, whereas the node N1 is turned to high level. As the fuse F2 is cut off, the fuse nodes FN2 to FN4 are preserved at high level, while the nodes N2 to N4 are preserved at low level by means of the fuse clump 7. Consequently, the transfer gates T1, T4, T6 and T8 are turned on. As a result, with the transfer gate T8 turned on, the node N21 is switched to high level, thereby the redundant column lines RCL0 and RCL1 are used in the place of the normal column lines CL2 and CL3.

Similarly, when the normal column lines CL0 and CL1 are released from operation by redundant function, the fuse F1 is cut off When the normal column lines CL4 and CL5 are released from operation by redundant function, the fuse F3 is cut off. When the normal column lines CL6 and CL7 are released from operation by redundant function, the fuse F4 is cut off. In a word, when a fuse is cut off, the column lines including the object of the redundant function and its succeeding column lines are shifted by one stage so that the redundant column lines RCL0 and RCL1 are used.

In the following, the operation of the Roll Call circuit 2 in case that the redundant column line is used due to the fuse F2 being cut off. The output node N6 of the inverter INV26 input of which is the output node N14 of the selected column decoder, is turned to high level, and the Nch transistor NT4, input of which is the output node N6 is turned on. The output node N1 of the fuse F1 is also at high level, and the Nch transistor NT5, input of which is the output node N1 is on. In addition, the output node N2 of the fuse F2 is at low level, and the Nch transistor T6, input of which is the output node N10 of the inverter INV22 with the output node N2 as its input, is also on.

As mentioned above, regarding the nodes N1 to N4 which function as the inputs of the Roll Call circuit 2, only the Nch transistors which are positioned where the nodes provided at the upstream thereof are at high level, and the nodes provided at the downstream are at low level are turned on. By turning on all the Nch transistors connected in series by threes, the output RCY which is output from the Roll Call circuit 2 is turned to low level. However, when the enable signal RCY-EN is turned from high to low level, the output RCY is turned from low to high level by means of the Roll Call clump 8. Thus, by monitoring the output RCY, it can be detected if the redundant function of the address is in operation, in other words, switching of the output RCY to low level indicates that redundant function is in operation.

However, the semiconductor memory device 500 in the prior art requires multiple Roll Call circuits, number of which must be equivalent to that of the fuses. In addition, the Roll Call clump is also required to control the output signal RCY of the Roll Call circuit. These necessitate a large pattern size.

SUMMARY OF THE INVENTION

An object of the present invention, which has been completed by addressing the problems of the semiconductor memory devices in the prior art discussed above, is to provide a new and improved semiconductor memory device in which the Roll Call circuit to detect if the redundant function is in operation can be provided with smaller number of elements so that the area required for the layout of the device can be decreased.

Another object of the present invention is to provide a new and improved semiconductor device which enables easy controlling of the Roll Call circuit.

Still another object of the present invention is to provide a new and improved semiconductor device in which the output from the Roll Call circuit can be realized at higher speed.

In order to achieve the above mentioned objects of the invention, there is provided a semiconductor memory device comprising n sets of memory cell blocks (n is a positive integer), n sets of decoder circuits that carry out the redundant operation and that are provided so as to correspond to the memory cell blocks, a judgment means which detects if the redundant function is in operation; wherein each decoder circuit outputs a first level decoder signal to the judgment means when the redundant function is not in operation, but outputs a second level decoder signal when the redundant function is in operation, and wherein the judgment means outputs a first level judgment signal when all the decoder signals are at the first level, but outputs a second level judgment signal when any of the decoder signals is at the second level.

With this, if it is necessary only to detect if redundant function is in operation or not, but the judgment of which address uses the redundant function is not required, controlling of the judgment means can be made easier.

One example of the semiconductor memory device as described in the above is characterized in that n is a positive integer of 3 or more, the judgment means includes n−1 sets of judgment circuits connected in series, and each judgment circuit comprises an NAND element and an inverter, input of which is connected to the output of the NAND element. In the semiconductor device as mentioned above, at least the decoder signal corresponding to the $i^{th}$ memory cell block (i is a integer from 1 to n−2) and the output signal from the inverter provided in the $i+1^{th}$ judgment circuit are input to the NAND element in the $i^{th}$ judgment circuit. In addition, the decoder signal corresponding to the $n−1^{th}$ memory cell block and the decoder signal corresponding to the $n^{th}$ memory cell block are input to the NAND element in the $n−1^{th}$ judgment circuit.

With this structure, sharp reduce in number of the elements in the judgment means can be realized. Further, the area required for the layout of the device can also be decreased since it is not necessary to provide a circuit for controlling the output signal from the judgment means.

More preferably, the semiconductor memory device according to the invention is constituted so that, to the NAND element in a judgment circuit is input the output signal of the inverter from the judgment circuit which is positioned at the upstream of said judgment circuit by two or more stages.

This structure enables speedup of the transmission of the output signal from the column decoder in case that the redundant operation is used. Therefore, this structure is effective to a device with large number of memory cell blocks having redundant function.

In addition, according to the present invention, there is provided a semiconductor memory device comprising n sets of memory cell blocks (n is a positive integer), n sets of decoder circuits that carry out the redundant operation provided so as to correspond to said memory cell blocks, n sets of read out means provided so as to correspond to the memory cell blocks for reading out data from the memory cell blocks, a judgment means which detects if the redundant function is in operation; wherein each decoder circuit outputs a first level decoder signal to the judgment means when the redundant function is in operation, but outputs a second level decoder signal when the redundant function is not operation, and wherein the $i^{th}$ output switching circuit (i is a integer from 1 to n) switches back and forth between the data read out from the $i^{th}$ read out means and the $i^{th}$ decoder signal, and outputs the switched data or signal.

In the semiconductor memory device structured as mentioned above, the judgment means may includes n sets of output switching circuit connected in series.

With this structure, judgment if the redundant function is in operation can be conducted at every memory cell block, as decoder circuits, the read out means and the memory cells having redundant correspond to output of the judgment means by one to one.

In one example of the semiconductor memory device as structured above, the output switching circuit includes two transfer gates and switches back and forth between said transfer gates with the first transfer gate to which the data read out by the $i^{th}$ read out means is input, and the second transfer gate to which $i^{th}$ decoder signal is input.

With this structure, as the judgment means includes the output switching circuits of which number is equivalent to that of the memory cell blocks and one element such as an inverter for switching the direction of output from the output switching circuits, the area required for layout can be made smaller, and the control of the device can be made easier.

Further, it is preferable that the semiconductor memory device according to the invention includes a latch means in the output switching circuits for switching back and forth between data read out from the $i^{th}$ read out means and the $i^{th}$ decoder signal and latching the switched signal or data.

With this structure, the present invention is advantageous in that the transfer gates are not necessary so that the junction capacity of the output of the output switching circuit can be small. In addition, output at higher speed can be realized since the data read out at the normal reading operation can be directly output.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIG. 17 is a timing chart illustrating the operation of the semiconductor memory device shown in FIG. 13 when judgment whether the redundant function is used is conducted.

DETAILED DESCRIPTION OF THE PREFERRED EMBODIMENTS

The following is a detailed explanation of the preferred embodiments of a semiconductor memory device according to the present invention. It is to be noted that in the following explanation and the attached drawings, the same reference numbers are assigned to members having essentially the same functions and structural features to preclude the necessity for repeated explanation thereof.
(First Embodiment)

Figure 2:
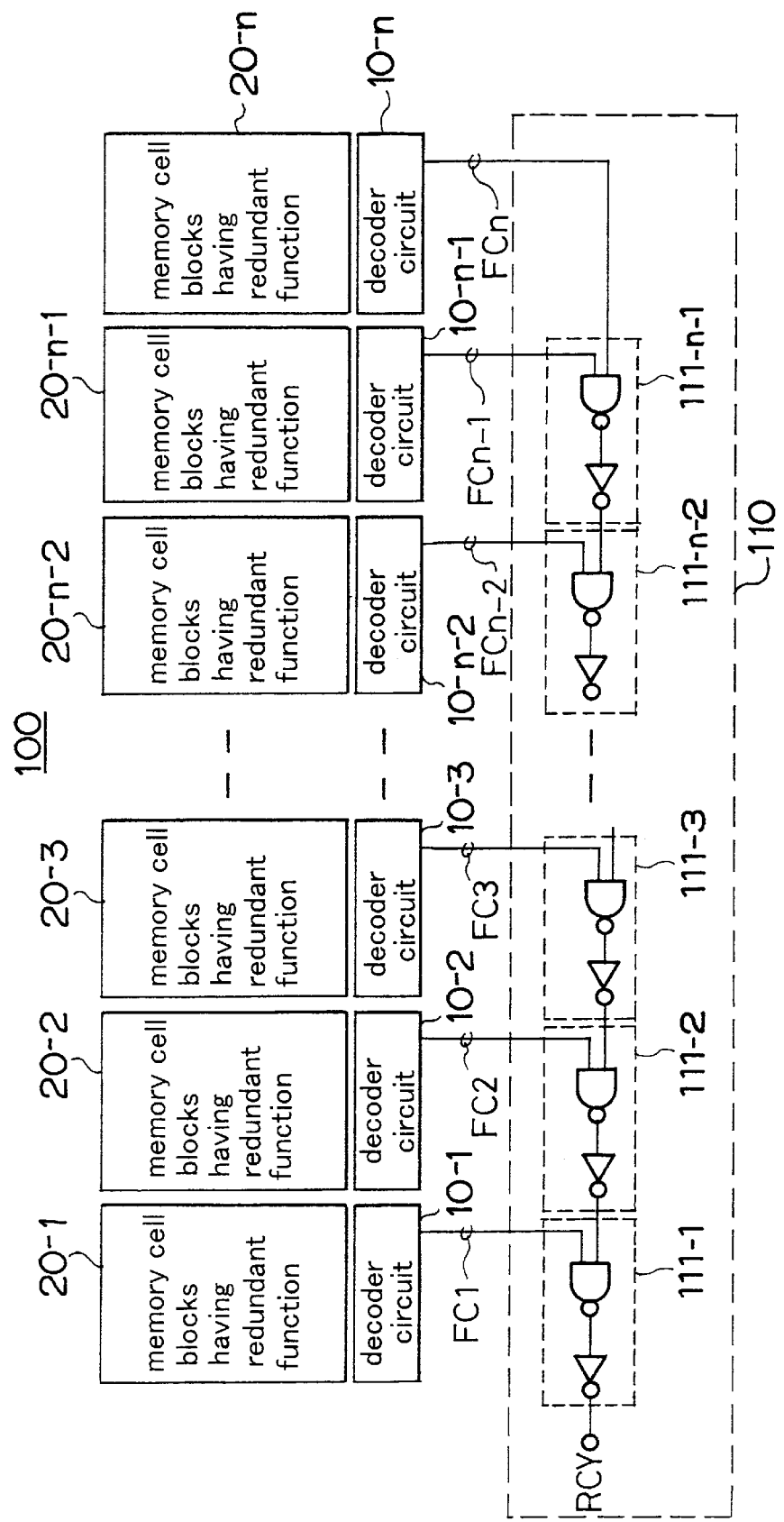
FIG. 2 illustrates a semiconductor memory device according to the first embodiment of the present invention.

As shown in FIG. 2, a semiconductor memory device 100 according to the first embodiment comprises n sets of memory cell blocks 20-i (i is an integer from 1 to n), n sets of decoder circuits 10-i for carrying out the redundant operation that are provided so as to correspond to each memory cell block, a Roll Call signal transmission circuit 110 for detecting if the redundant function is in operation or not.

Figure 1:
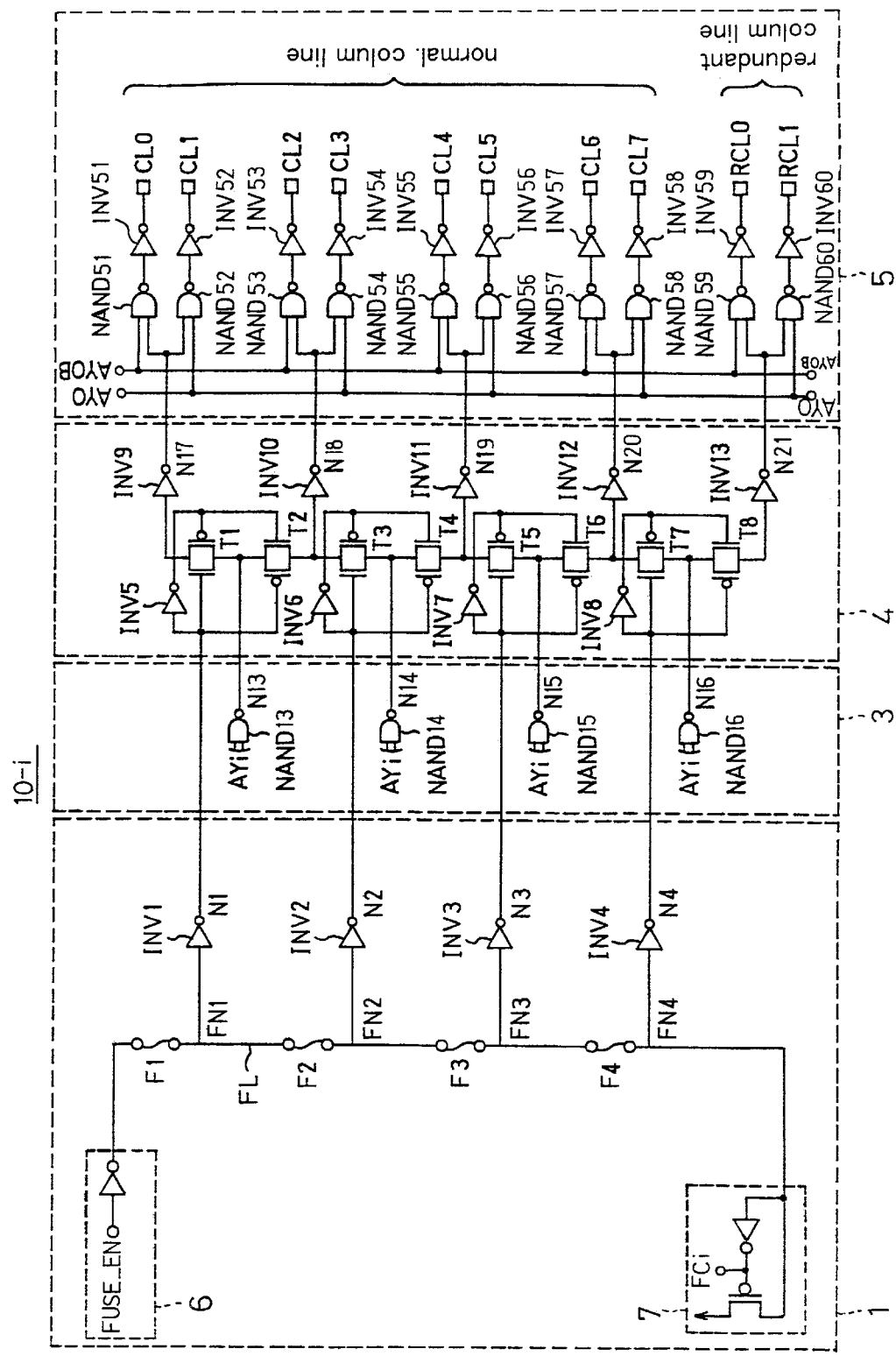
FIG. 1 illustrates a decoder circuit in the semiconductor memory device according to the present invention.

The decoder circuit 10-i in the semiconductor memory device 100 comprises a redundant fuse 1, a column decoder 3, a column decoder switching circuit 4 and a column driver 5, as shown in FIG. 1. A fuse clump 7 in the redundant fuse 1 that outputs the decoder signal FCi is connected with a Roll Call signal transmission circuit 110. The decoder signal FCi is at low level when the redundant function is used, but it is at high level when the redundant function is not used.

With regard to the structure and connection of the components of the decoder circuit 10, it is essentially identical to that of the decoder circuit 9 of the semiconductor memory device 500 in the prior art, except that the decoder circuit 10 outputs the decoder signal FCi. Therefore, the detailed explanation of the structure and connection of the decoder circuit 10 is omitted. In the following, the Roll Call signal transmission circuit 110, which is the characteristic of the first embodiment of the present invention, is explained with reference to FIG. 2.

In the Roll Call signal transmission circuit 110, n−1 sets of Roll Call circuits 111-i (i is an integer from 1 to n−1) are connected in series. Each Roll Call circuit 110-i comprises an NAND element and an inverter, input of which is the output of the NAND element. To the NAND element of the Roll Call circuit 111-i (i is an integer from 1 to n−2) is input to the decoder signal FCi output from the corresponding decoder circuit 10-i and the output signal from the inverter in the Roll Call circuit 111-i+1 connected in the upstream. To the NAND element of the Roll Call circuit 111-n−1 is input to the decoder signal FCn−1 and the decoder signal FCn.

Figure 3:
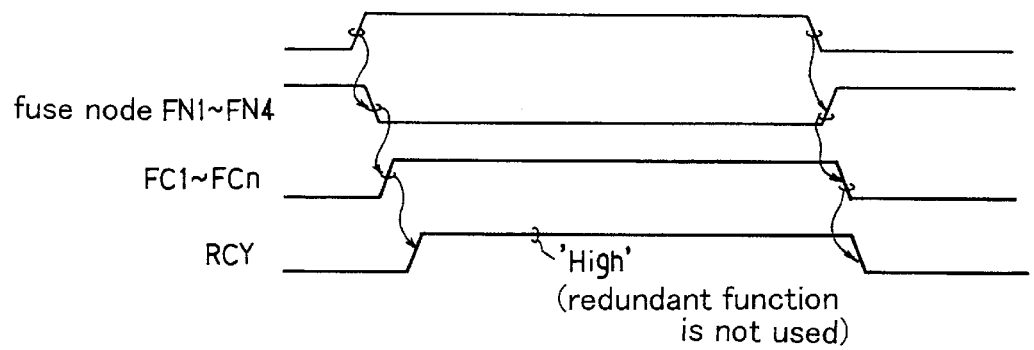
FIG. 3 is a timing chart for explaining the operation of the semiconductor memory device shown in FIG. 2 when the redundant function is not in operation.

Next, the operation of the semiconductor memory device 100 structured as described above is explained with reference to FIGS. 3 and 4. First, the operation when redundant column lines are not used in any of the decoder circuits is explained with reference to FIG. 3.

When a fuse enable signal FUSE-EN which enables the column decoder to start operation is turned from low to high level in each decoder circuit, if any of the fuses F1 to F4 on the fuse wiring FL are not cut off, the fuse nodes FN1 to FN4 on the fuse wiring FL is turned from high to low level. In this case, the redundant column lines are not used. At this stage, the decoder signal FCi from the fuse clump 7 is turned from low to high level.

When the decoder signal FCi is turned to high level, the output of the NAND element in the Roll Call circuit 111-n−1 to which the decoder signals FCn and FCn−1 are input is turned to low level. Then output from Roll Call circuit 111-n−1 is turned to high level through the inverter element. The output from Roll Call circuit 111-n−2 to which the output from the Roll Call circuit 111-n−1 and the decoder signal FCn−2 are input is also outputs a high. Similarly, outputs from other Roll Call circuits are at high level. Thus, the Roll Call signal transmission circuit 110 outputs the output RCY at high level.

Figure 4:
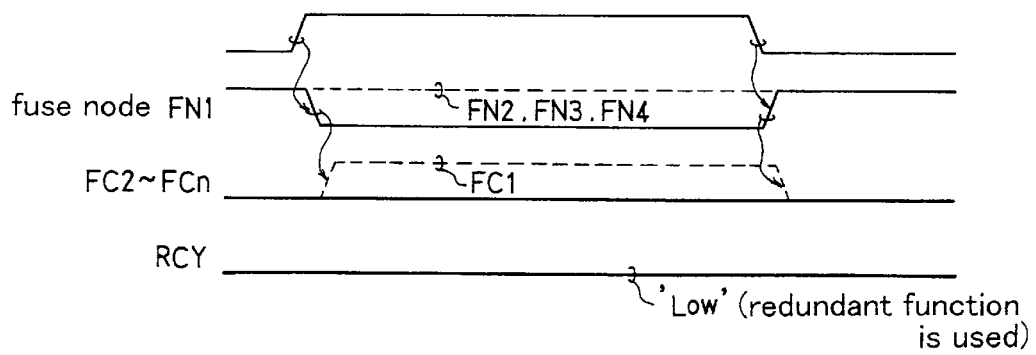
FIG. 4 is a timing chart for explaining the operation of the semiconductor memory device shown in FIG. 2 when the redundant function is in operation.

Next, the operation when the redundant column lines are used in any of the decoder circuit is explained with reference to FIG. 4. Here, the operation in case that the redundant column lines are not used in any decoder circuits but the decoder circuit 100-3 is explained as an example.

In the decoder circuit 100-3, when a fuse enable signal FUSE-EN which enables the column decoder to start operation is turned from low to high level, if any of the fuses F1 to F4 on the fuse wiring FL are cut off, the fuse nodes positioned at the downstream of the blown fuse are at low level. In this case, the redundant column lines are used. At this stage, the decoder signal FC3 from the fuse clump 120-3 is turned from high to low level.

With the decoder signal FC3 turned to low level, the output from the NAND element of the Roll Call circuit 111-3 to which the decoder sign FC3 and the output from the Roll Call circuit 111-4 are input is turned to high level, the output from the Roll Call circuit 111-3 is turned to low level through the inverter element. Similarly, the output from the Roll Call circuit 111-2, to which the output from the Roll Call circuit 111-3 and the decoder signal FC2 are input is turned to low level. Thus, the output RCY of the Roll Call signal transmission circuit is turned to low level. In short, when the redundant column lines are used in any of the column decoder circuit, the output from the corresponding Roll Call circuit is turned to low level. As a result, all the output from the Roll Call circuit positioned at the downstream of the Roll Call circuit of the object of the redundant operation are turned to low level, thereby turning the output RCY to low level.

As described so far, when the redundant column lines are not used in any column decoder circuit, the output RCY is at high level, whereas the output RCY is at low level, when the redundant column lines are used in any of the column decoder circuit. Accordingly, the judgment whether the redundant function is in operation in entire semiconductor memory device can be conducted by monitoring the output RCY.

The semiconductor memory device 100 with the above mentioned structure and operation has the following advantages. The control of the Roll Call circuits can be made much easier, if it is necessary to detect only if the redundant circuit is used or not, though, unlike the semiconductor memory device in the prior art, the semiconductor memory device according to the present invention can not detect the address in which the redundant function is used. In addition, the number of elements in the Roll Call circuit can be reduced comparing to that in the prior art. The circuit for controlling the output signal RCY of the Roll Call circuit can be omitted so that the area required for layout of the device can be made smaller.

(Second Embodiment)

The structure of a semiconductor memory device 200 according to the second embodiment of the present invention is explained with reference to the FIG. 5. The semiconductor memory device 200 is achieved by improving the semiconductor memory device 100 according to the first embodiment of the invention. More precisely, the Roll Call circuit 110 of the semiconductor memory device 100 is replaced with a Roll Call circuit 210. It is to be noted that explanation of the structural components of the semiconductor memory device 200, which are the essentially the same as those of the semiconductor memory device 100 is omitted.

Figure 5:
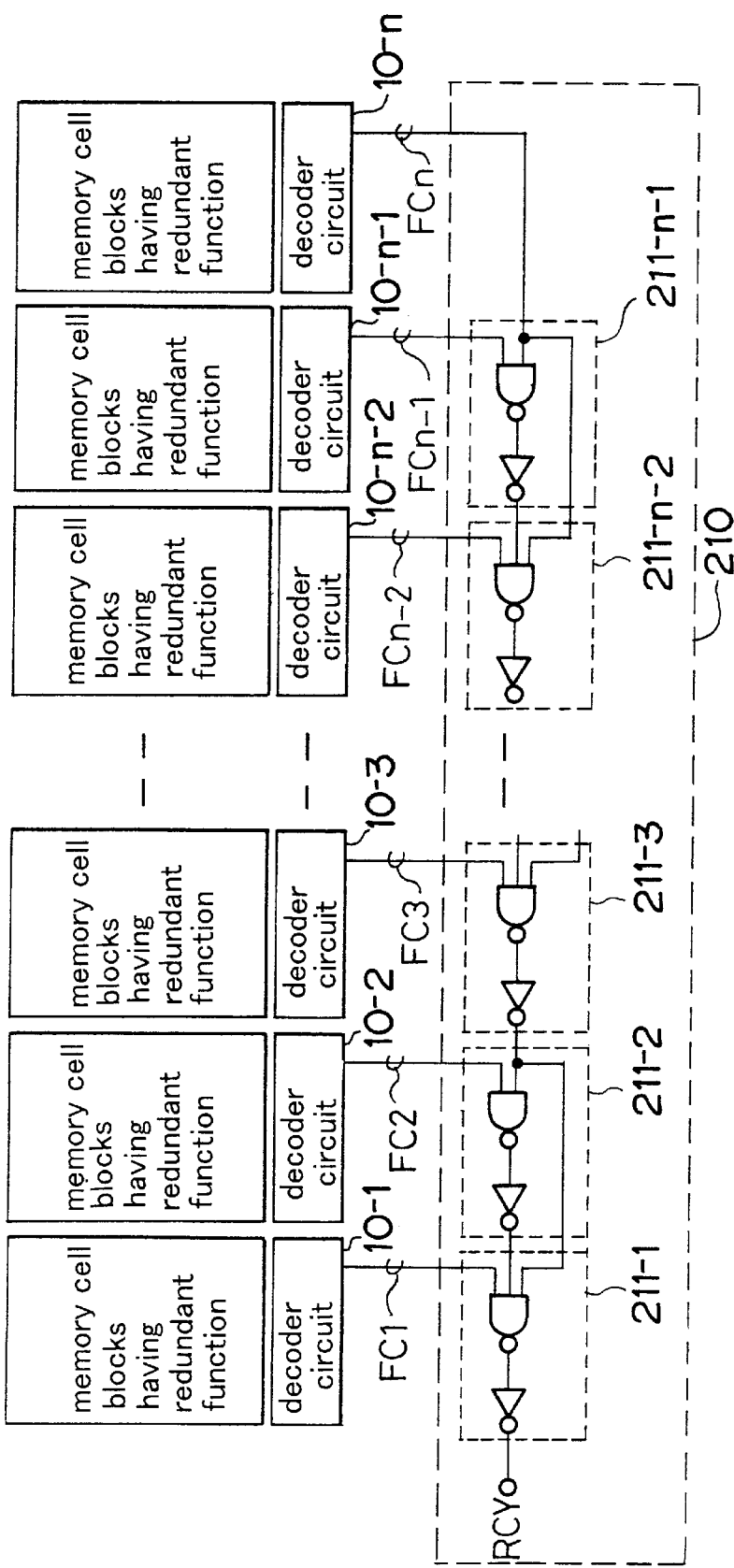
FIG. 5 illustrates a semiconductor memory device according to the second embodiment of the present invention.

In the Roll Call signal transmission circuit 210, as shown in FIG. 5, an output signal FCn positioned at the most upper stream is input not only to an NAND element of the Roll Call circuit 211-n-1 but also to the NAND element of the next Roll Call circuit 211-n-2. The other Roll Call circuits are connected in the same way so that the output from the Roll Call circuit 211-3 is input not only to the NAND element of the Roll Call Circuit 211-2 but also to the NAND element of the Roll Call circuit 211-1.

Next, the operation of the semiconductor memory device 200 structured as mentioned above is explained. The operation of the semiconductor memory device 200 is essentially identical to that of the semiconductor memory device 100 according to the first embodiment except that the decoder signal FCn at high level is transmitted in skipping over every other Roll Call circuit, when the redundant circuits are not used.

The semiconductor memory device 200 with the above mentioned structure and operation has the following advantages. In the semiconductor memory device 200, when the redundant circuits are used, the decoder signal FCi can be transmitted at higher speed so that the time required to output the output RCY from the Roll Call signal transmission circuit 210 can be reduced by half comparing with the semiconductor memory device 100. This structure is effective to a device with large number of memory cell blocks having redundant function.

In this embodiment, the Roll Call circuit in which time for outputting the output RCY can be reduced to half is described, the present invention is not limited to this structure. If the output from the Roll Call circuit is connected to the circuit two circuit over, the time required to output the output RCY can be reduced to one third. Similarly, further speedup is possible by connecting the output from the Roll Call circuit 3 or more circuits over.

(Third Embodiment)

The structure of a semiconductor memory device 300 according to the third embodiment of the present invention is explained with reference to the FIG. 6. The semiconductor memory device 300 is achieved by improving the semiconductor memory device 200 according to the second embodiment of the invention. More precisely, the Roll Call circuit 210 of the semiconductor memory device 200 is replaced with a Roll Call circuit 310. It is to be noted that explanation of the structural components of the semiconductor memory device 300, which are the essentially the same as those of the semiconductor memory device 200 is omitted.

Figure 6:
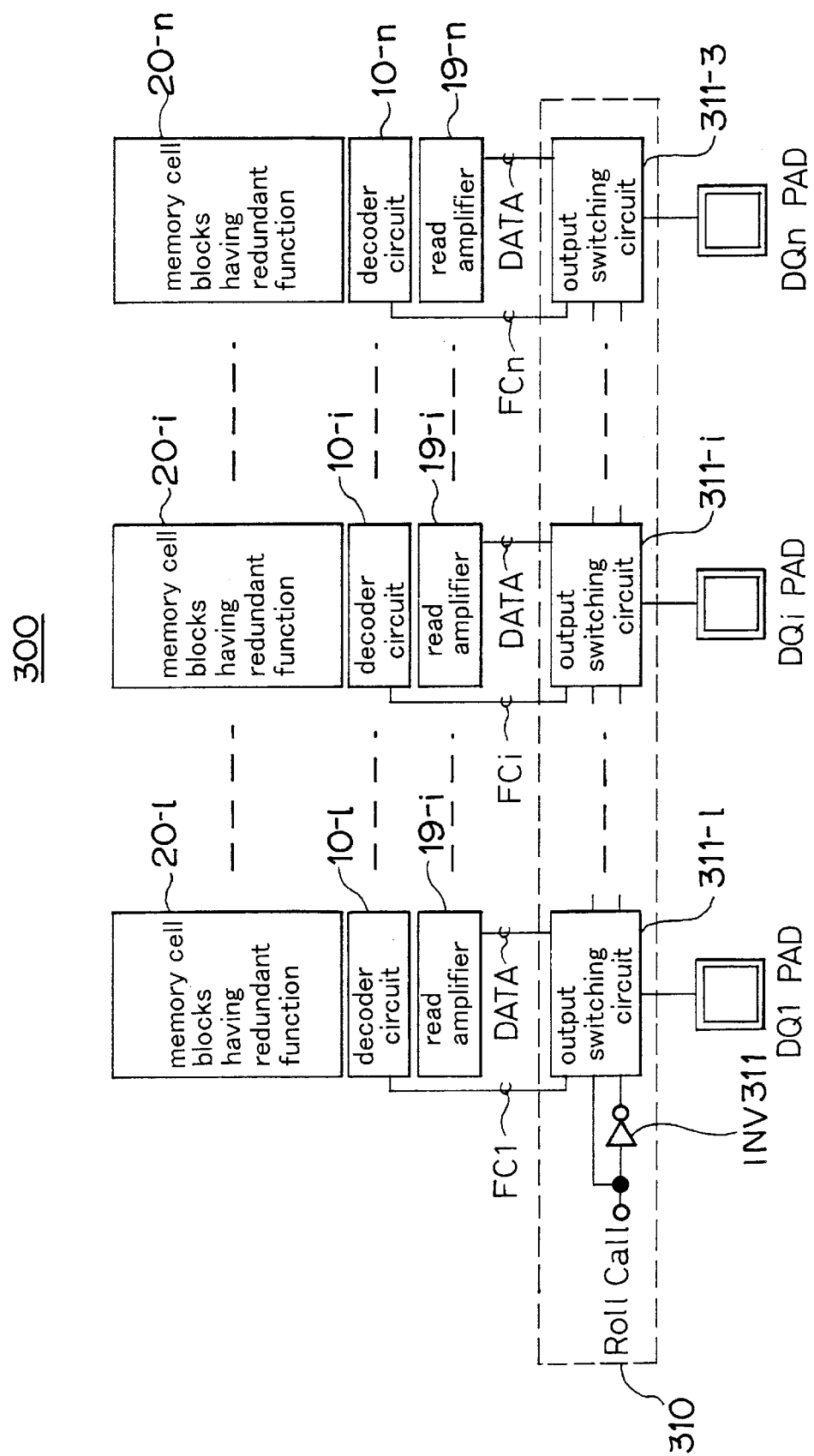
FIG. 6 illustrates a semiconductor memory device according to the third embodiment of the present invention.

As shown in FIG. 6, the semiconductor memory device 300 comprises memory cell blocks 20-i (i is an integer from 1 to n) with redundancy, decoder circuit 10-i, read amplifiers 19-i and the Roll Call circuit 310. In this embodiment, the memory cell blocks 20-i, the decoder circuits 10-i, read amplifiers 19-i and an output pads DQiPAD of the Roll Call circuit 310 have one-to-one correspondence.

The Roll Call circuit 310 includes output switching circuits 311-i corresponding to the memory cell blocks 20-i and an inverter INV311 to which a signal Roll Call for controlling the output switching circuits 311-i is input. The signal Roll Call rises by applying high voltage to a pad connected with a circuit so-called a super voltage (not shown).

Figure 7:
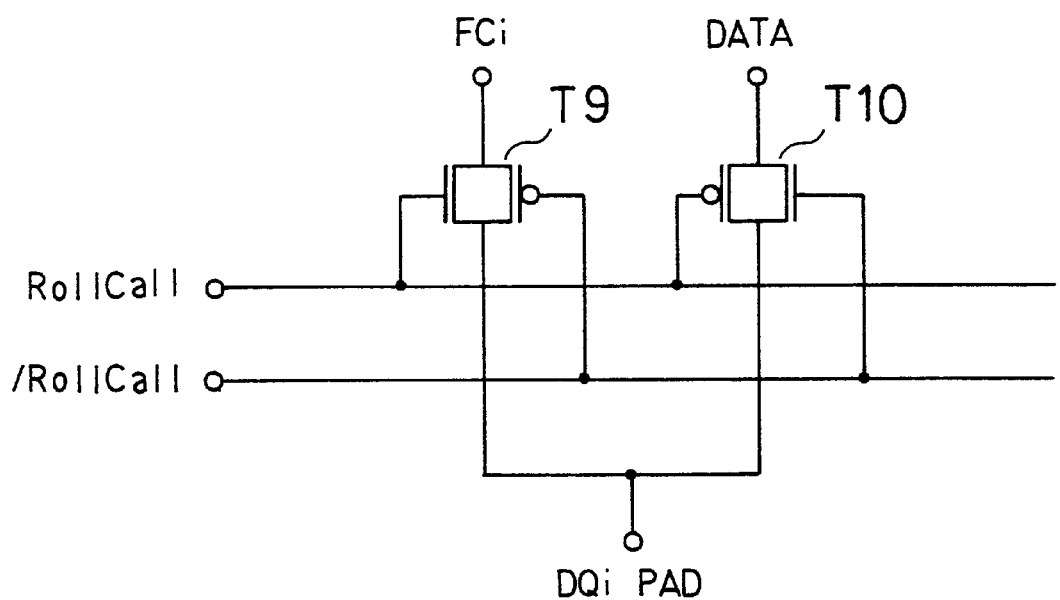
FIG. 7 illustrates an output switching circuit according to the present invention.

As shown in FIG. 7, the output switching circuit 311-i comprises transfer gates T9 and T10 for switching read data DATA and decoder signals FCi. The switching operation is controlled by the signal Roll Call. The read data DATA is amplified by the read amplifier 19-i, while the decoder signal FCi is output from the decoder circuit 10.

When the signal Roll Call is at high level, the transfer gate T9 is turned on, the decoder signal FCi output from the decoder circuit 10 is thereby output to the output pad DQiPAD. On the contrary, when the signal Roll Call is at low level, the transfer gate T10 is turned on, the read data DATA output from the read amplifier 19-i is thereby output from the output pad DQiPAD.

In the following, the operation of the semiconductor memory device 300 structured as mentioned above is explained. The DQ1 is focussed here to explain an example of the operation. When it is not necessary to detect whether the redundant circuit is used or not, the Roll Call sign is preserved at low level, and thereby connecting the read data DATA with the output pad DQiPAD. With this, if the reading operation is carried out, the read data DATA is output to the output pad DQiPAD. In case that the judgment is conducted, the Roll Call signal is turned to high level, thereby connecting the decoder signal FCi with the output pad DQiPAD. Thus the result of the judgment is output to the output pad DQiPAD. When the redundant circuit is not used, the decoder signal FCi at high level is output to the output pad DQiPAD, whereas the decoder signal FCi at low level is output to the output pad DQiPAD, when the redundant circuit is used.

The semiconductor memory device 300 with the above mentioned structure and operation has the following advantages. In the semiconductor memory device 300, judgment whether the redundant function is in operation can be conducted at every memory cell block, as there is a one-to-one correspondence among the memory cells 20-i, the decoder circuits 10-i, the read amplifiers 19-i and the output pads DQiPAD.

In addition, the Roll Call Circuit 310 comprises the output switching circuits 311-i number of which is equivalent to that of the output pad DQiPAD, and one inverter INV311 for controlling the output switching circuits 311-i. With this structure, the Roll Call circuits 310 can be realized with smaller number of elements compared with the Roll Call signal transmission circuit 210 of the semiconductor memory device 200. Thus, the are area required for the layout of the device can be reduced, and the control of the device can be made easier.

(Fourth Embodiment)

The structure of a semiconductor memory device 400 according to the fourth embodiment of the present invention is explained with reference to the FIG. 8. The semiconductor memory device 400 is achieved by improving the semiconductor memory device 300 according to the third embodiment of the invention. More precisely, the Roll Call circuit 310 of the semiconductor memory device 300 is replaced with a Roll Call circuits line 410. It is to be noted that explanation of the structural components of the semiconductor memory device 400 which are essentially the same as those of the semiconductor memory device 300 is omitted.

Figure 8:
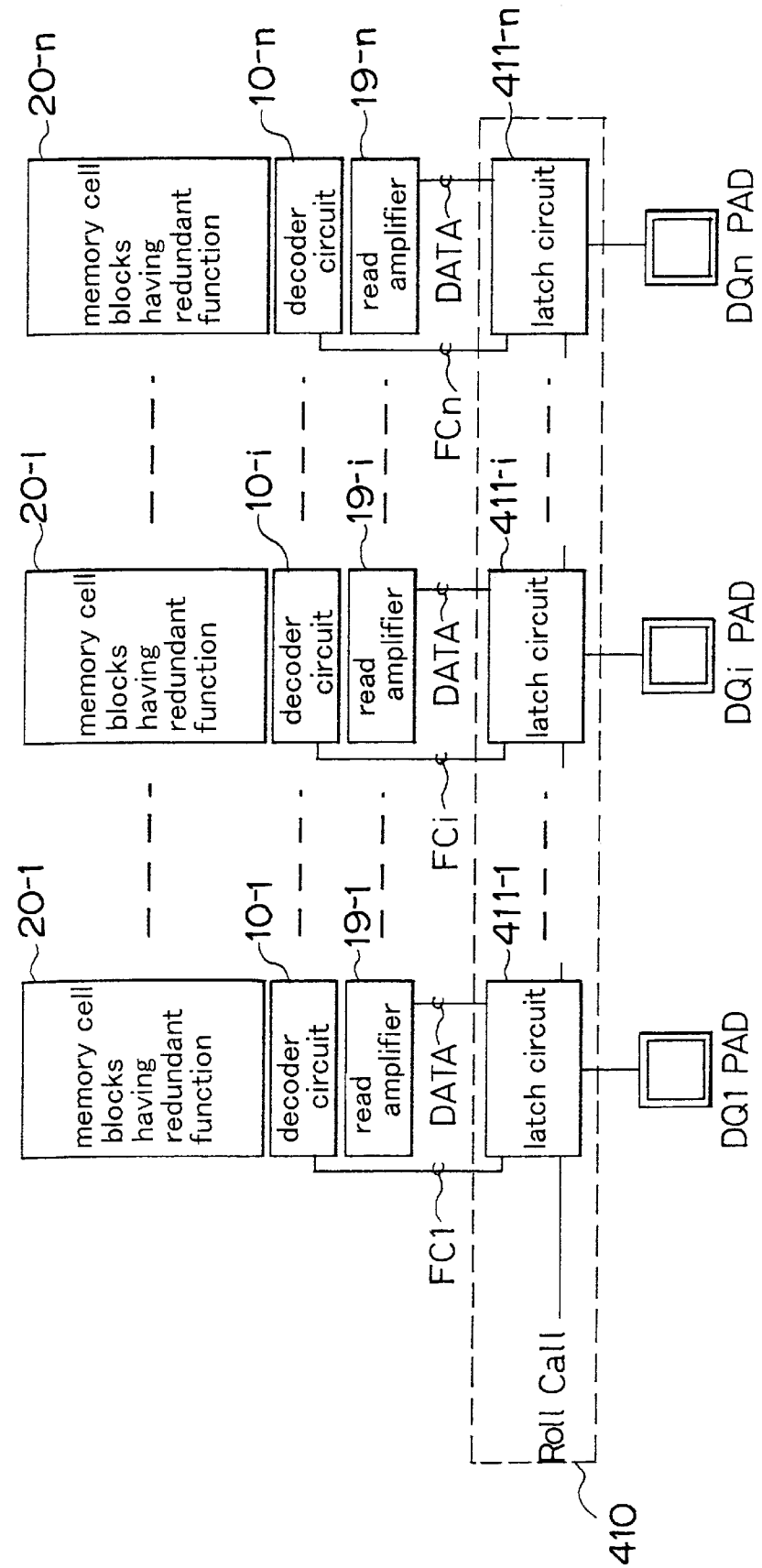
FIG. 8 illustrates a semiconductor memory device according to the fourth embodiment of the present invention.

As shown in FIG. 8, the semiconductor memory device 400 comprises memory cell blocks 20-i (i is an integer from 1 to n) with redundancy, decoder circuit 10-i, read amplifiers 19-i and the Roll Call circuits line 410. In this embodiment, the memory cell blocks 20-i, the decoder circuits 10-i, read amplifiers 19-i and an output pads DQiPAD of the Roil Call circuits line 410 have one-to-one correspondence.

The Roll Call circuits line 410 includes latch circuits 411-i which correspond to the memory cell blocks 20-I having redundant. The Roll Call signal is input to the Roll Call circuits line 410 to control the latch circuits 411-i.

Figure 9:
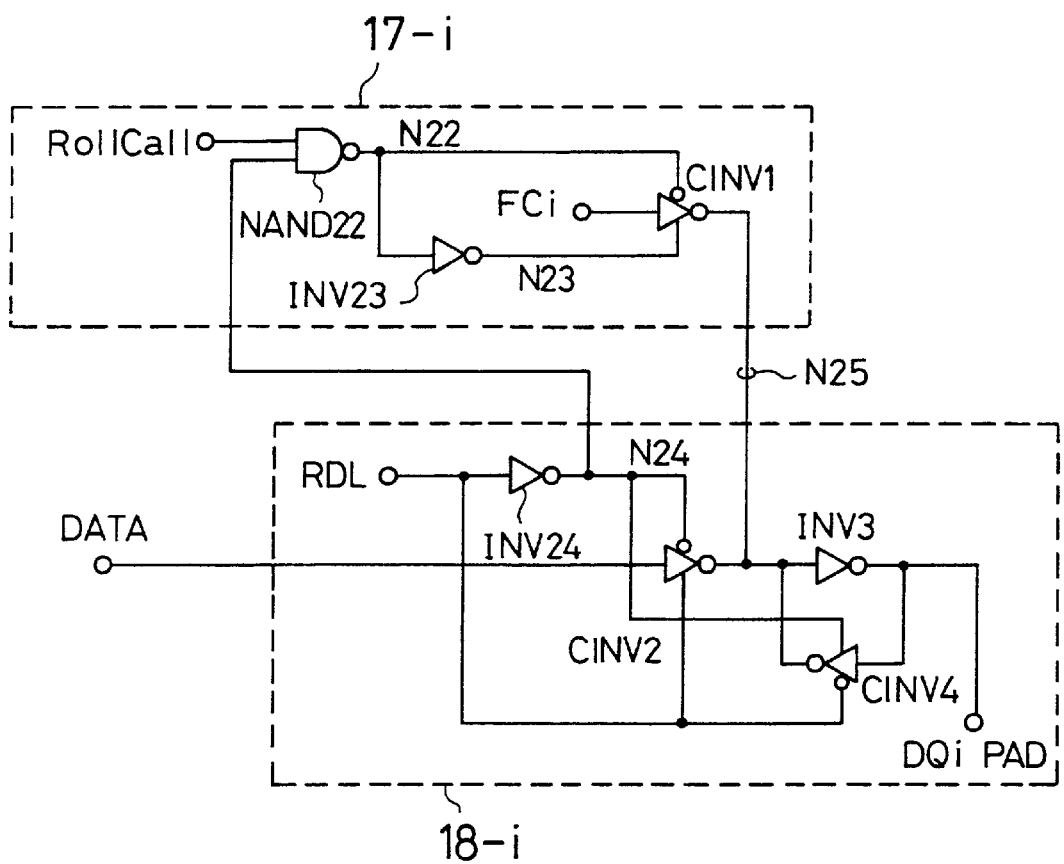
FIG. 9 illustrates a latch circuit according to the present invention.

As shown in FIG. 9, the latch circuit 411-i includes a Roll Call circuit 17 and a read data latch circuit 18. The decoder signal FCi is input to the Roll Call circuit 17 that is controlled by the Roll Call signal to output the decoder signal FCi to a latch node N25. The read data DATA is input to the read data latch circuit 18 that is controlled by a signal RDL to output the read data DATA to the latch node N25. The signal RDL is activated by the signal which is called a read amplifier driving signal. The read data DATA is latched by the signal RDL while the read amplifier 19-i is in operation.

The Roll Call circuit 17-i comprises an NAND element NAND 22, an inverter INV23 and a docked inverter CINV1. The Roll Call signal and the output from a node N24 in the data latch circuit 18-i are input to the NAND element NAND 22. The output from the NAND element NAND 22 is input to the inverter INV23. The output from the NAND element NAND 22 and the output from the inverter INV23 are input to the clocked inverter CINV1. The Roll Call signal is at high level when it is necessary to detect whether the redundant circuit is used or not, but the Roll Call signal is at low level when the judgment is not necessary. The decoder signal FCi is input to the docked inverter CINV1 that does or does not output the decoder signal FCi to the data latch node N25 under control of the Roll Call signal. The data latch node N25 is connected with the read data latch circuit 18, more particularly, with the output pad DQiPAD.

By adopting the above-mentioned structure, in the Roll Call circuit 17-i, when the judgment whether the redundant circuit is used or not is conducted, the decoder signal FCi is latched at the data latch node N25, the decoder signal FCi is thereby output to the output pad DQiPAD.

The read data latch circuit 18-i is provided with clocked inverters CINV2 and CINV4. The signal RDL and the signal generated by inverting the signal RDL through the inverter 24 are input to the clocked inverter CINV2. The read data DATA that is input to the docked inverter 2 is controlled its output from the clocked inverter CINV2 by the signal RDL. The inverted signal of the signal RDL by means of the inverter INV24 is output to the node 24 and input to the NAND element NAND 22 in the Roll Call circuit 17.

The signal RDL and the signal generated by inverting the control signal RDL through the inverter INV24 are input to the docked inverter CINV4. The signal output from the clocked inverter CINV2 and inverted through the inverter INV3 is controlled by the output from the clocked inverter CINV4 in accordance with the signal RDL. The output from the clocked inverter CINV4 is again input to the inverter INV3. The output from the inverter INV3 is output from the output pad DQiPAD.

By adopting the above-mentioned structure, in the read data latch circuit 18, when the judgment whether the redundant circuit is used or not is not conducted, the read data DATA is latched at the data latch node N25, the read data DATA is thereby output to the output pad DQiPAD.

Figure 10:
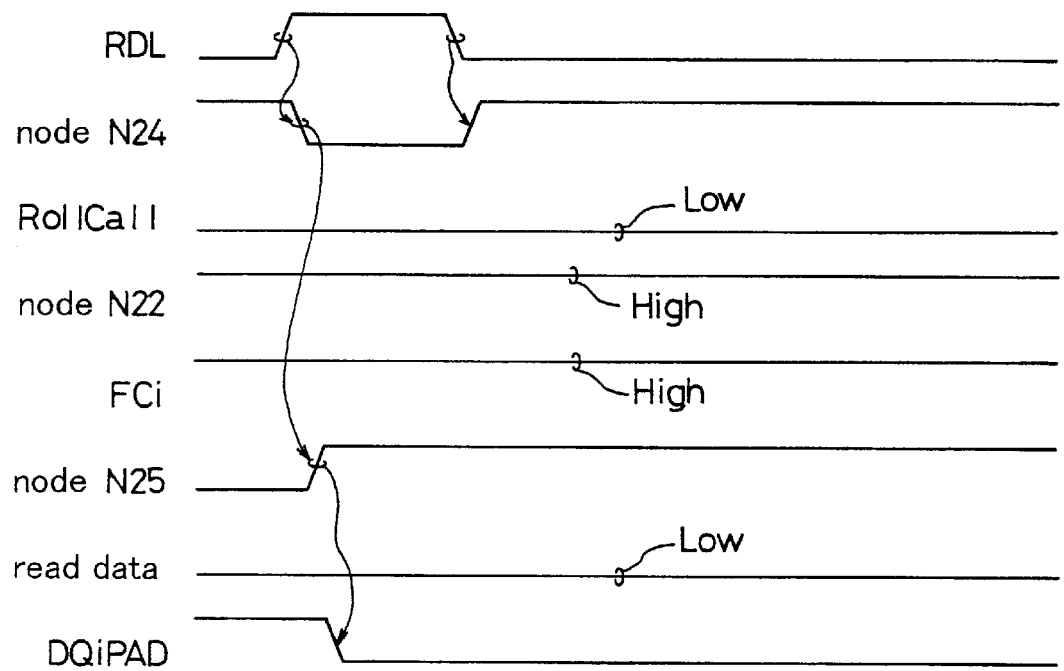
FIG. 10 is a timing chart illustrating the operation of the semiconductor memory device shown in FIG. 8 when judgment whether the redundant function is used is not conducted.

In the following, the operation of the semiconductor memory device 400 structured as mentioned above is explained wit reference to FIGS. 10 and 11. First, the operation when the judgment whether the redundant circuit is used or not is not conducted, in other words, when the Roll Call signal is at low level is explained with reference to FIG. 10.

In the read data latch circuit 18, when the signal RDL for controlling the read data DATA is turned from low to high level, the node N24 is turned from high to low level. As a result, the clocked inverter CINV2 is turned on. If the read data DATA is at low level, the data latch node N25 is turned to high level, and the output pad DQiPAD is turned to low level by means of the inverter INV3. In the meantime, the Roll Call circuit 17 does not operate, because the Roll Call signal is at low level. Consequently, the latch circuit 411-i conducts the normal reading operation and outputs the read data DATA to the output pad DQiPAD.

Figure 11:
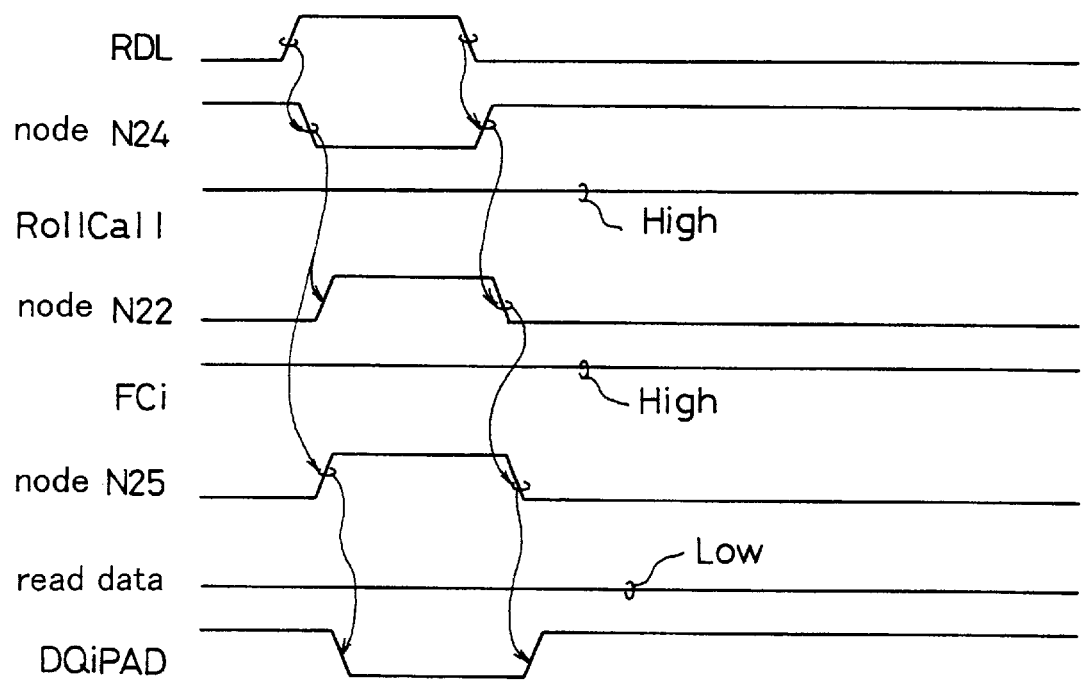
FIG. 11 is a timing chart illustrating the operation of the semiconductor memory device shown in FIG. 8 when judgment whether the redundant function is used is conducted.
Figure 12:
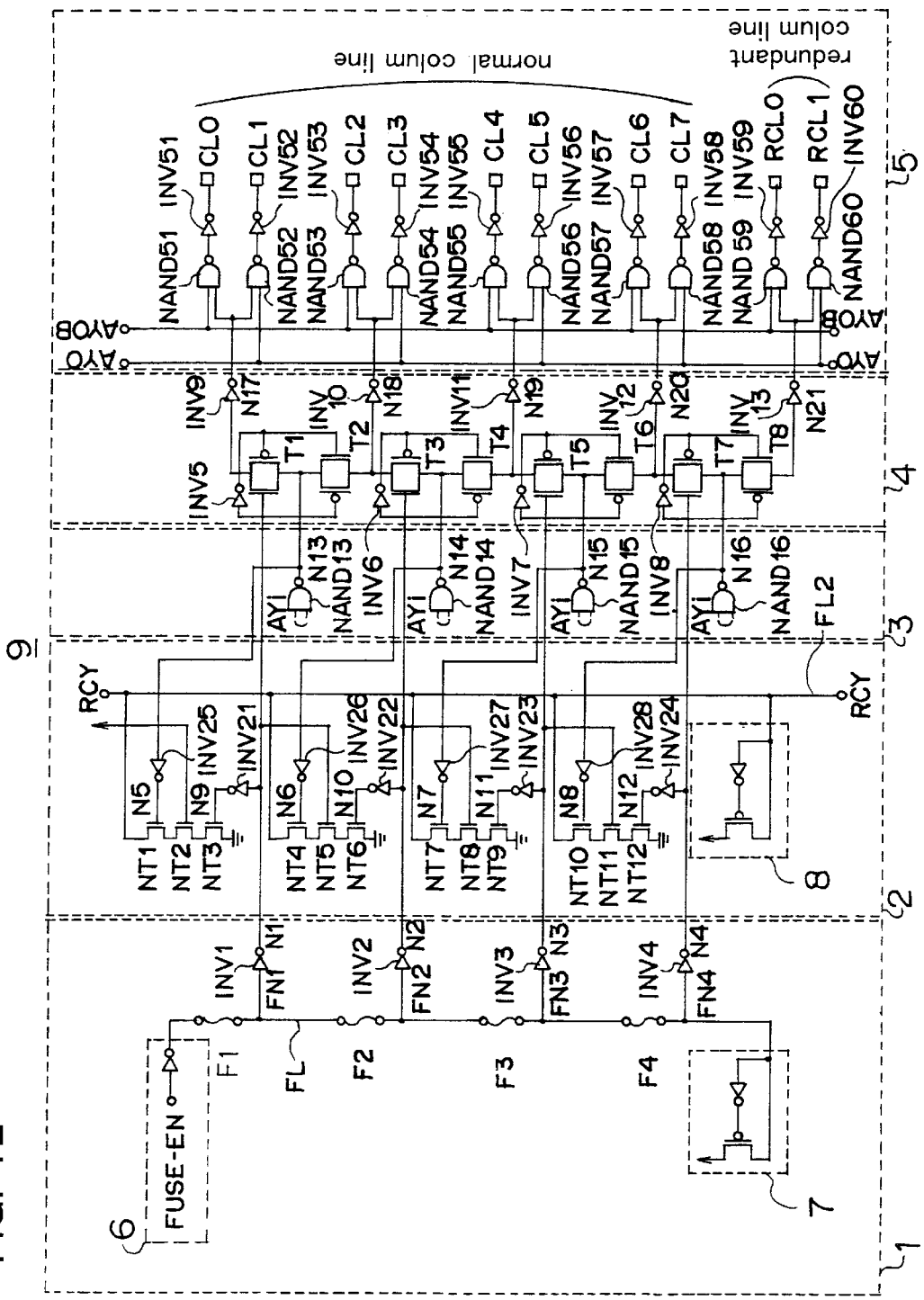
FIG. 12 illustrates a decoder circuit in the semiconductor memory device in the prior art.
Figure 13:
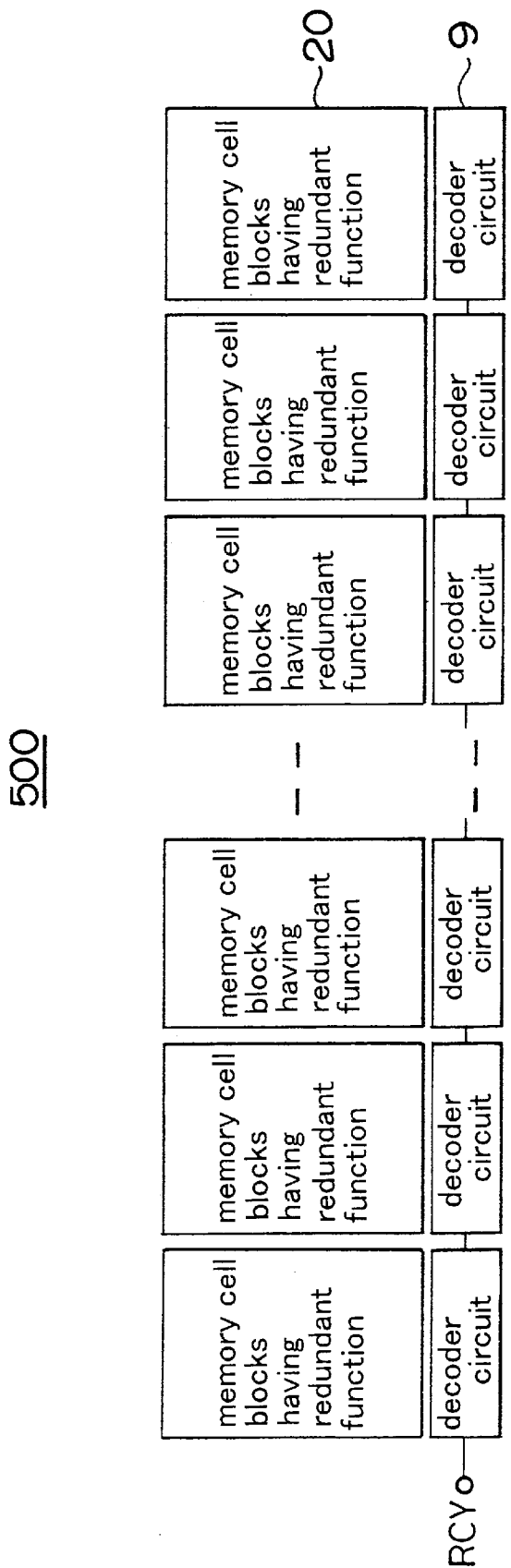
FIG. 13 illustrates a semiconductor memory device in the prior art.
Figure 14:
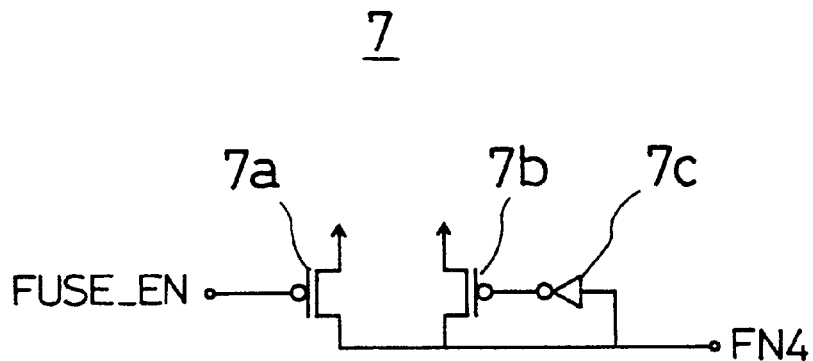
FIG. 14 illustrates a fuse clump in the semiconductor memory device in the prior art.
Figure 15:
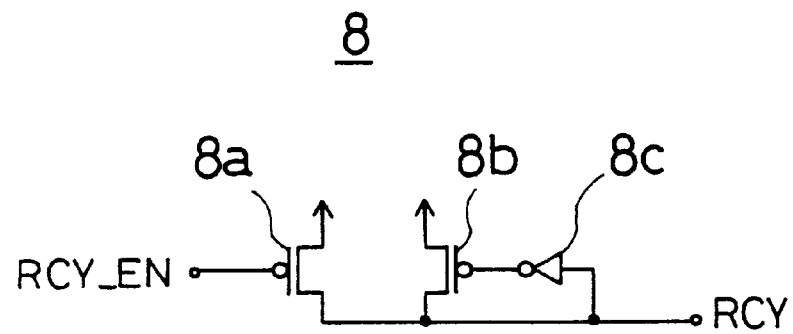
FIG. 15 illustrates a Roll Call clump in the semiconductor memory device in the prior art.
Figure 16:
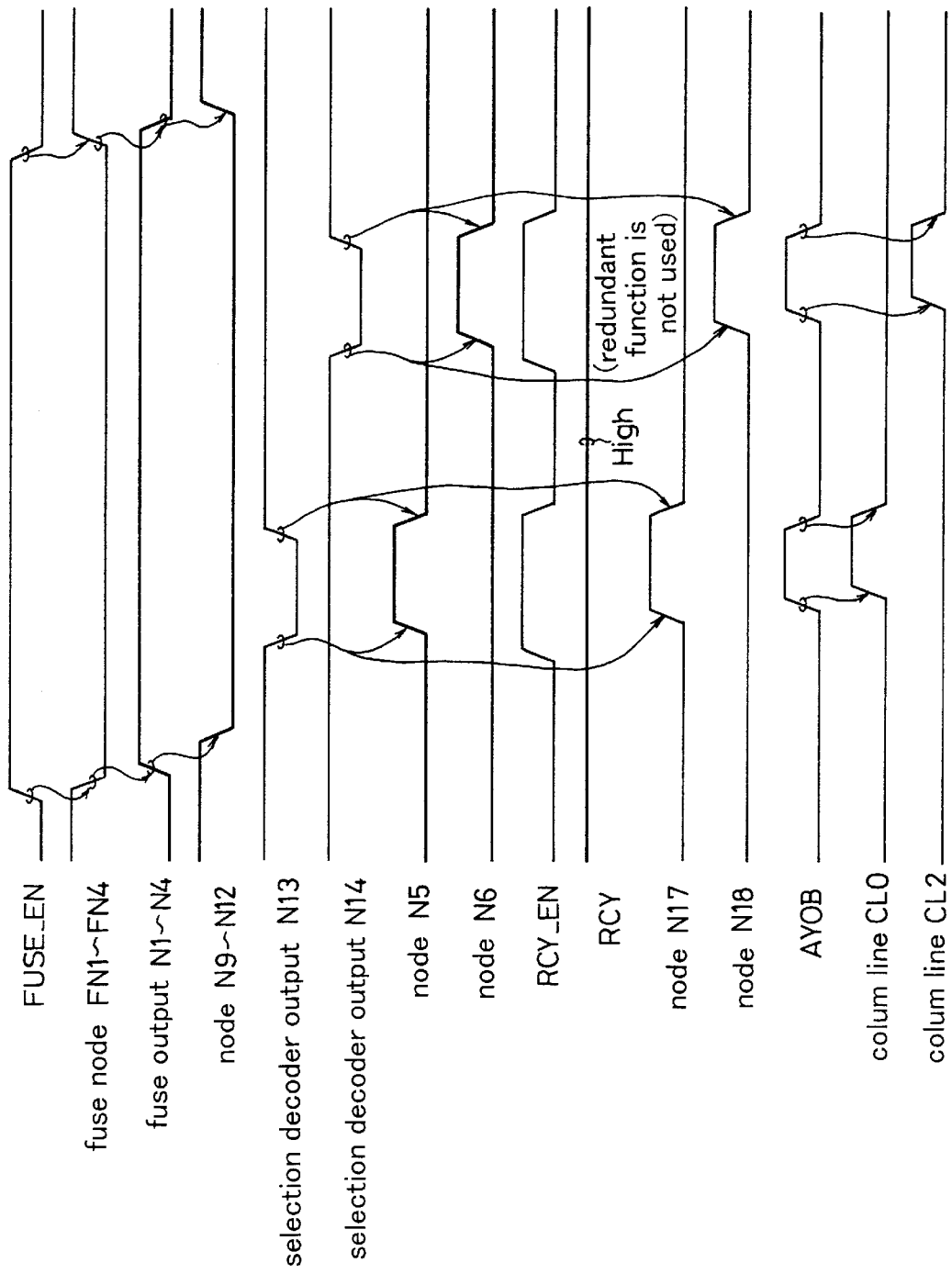
FIG. 16 is a timing chart illustrating the operation of the semiconductor memory device shown in FIG. 13 when judgment whether the redundant function is used is not conducted.

Next, the operation when the judgment whether redundant circuit is used or not is conducted, in other words, when the Roll Call signal is at high level, and the redundant circuit is not used is explained with reference to FIG. 11.

When the signal RDL for controlling the read data DATA that is amplified by the read amplifier 19 is turned from low level to high level, and again tuned to low level, the read data latch circuit 18-i latches the node N25 at high level and outputs a low to the output pad DQiPAD in the same way as the operation when the judgment is not conducted. The Roll Call circuit 17 starts operation when the Roll Call signal is at high level and the node N24 is at high level.

When the redundant circuit is not used, the decoder signal FCi is at high level. The docked inverter CINV1 outputs a low to the data latch node N25. The node N25 is latched at high level by the read data latch circuit 18, the node N25 is forcibly turned to low level by the clocked inverter CINV1. In short, the output pad DQiPAD outputs the read data DATA first, then outputs the decoder signal FCi from the Roll Call circuit 17. If the redundant circuit is used, the decoder signal FCi is at low level. In this case, the clocked inverter CINV1 outputs a high to the data latch node N25.

The semiconductor memory device 400 with the above mentioned structure and operation has the following advantages. In the semiconductor memory device 400, it is not necessary to provide the transfer gates T9 and T10 which are positioned between the read amplifiers 19-i and the output pads DQiPAD in the semiconductor memory device 300. Therefore, the junction capacity of the output pads DQiPAD can be made smaller. In addition, as the read data DATA are directly output to the output pad DQiPAD at the normal reading operation, the data can be output at higher speed compared with the device according to the third embodiment.

While preferred embodiments have been particularly shown and described with respect to the semiconductor memory device according to the present invention by referring to the attached drawings, the present invention is not limited to these examples and it will be understood by those skilled in the art that various changes in form and detail may be made therein without departing from the spirit, scope and teaching of the invention.

For example, in the second embodiment, the output from a Roll Call circuit is input to the NAND element of the Roll Call circuit one circuit over, the present invention is not limited to this structure. It is also applicable to the present invention that the output signal from the Roll Call circuit is connected to the circuit two or more circuits over.

Further, in the third and fourth embodiment, the output switching circuit and latch circuit are explained, respectively, as a means to switch the read data and the decoder signals. However, the present invention is not limited to these structures. Any arbitrary means having the same function can be applicable to the present invention.

As has been described so far, according to the present invention, the following advantageous effect can be achieved.

According to the one aspect of the present invention, the control of the judgment means can be made much easier, if it is necessary only to detect if the redundant circuit is used or not, though, unlike the semiconductor memory device in the prior art, the semiconductor memory device according to the present invention can not detect the address in which the redundant function is used.

In addition, the number of elements in the judgment means circuit can be reduced comparing to that in the prior art. The circuit for controlling the output signal of the judgment means can be omitted so that the area required for layout of the device can be made smaller.

Further, according to another aspect of the present invention, when the redundant circuits are used, the output signal from the column decoder can be transmitted at higher speed so that the time required to output the output signal from the judgment means circuit can be more than twice as fast. This structure is effective to a device with large number of memory cell blocks having redundant function.

According to another aspect of the present invention, judgment whether the redundant function is in operation can be conducted at every memory cell block, as there is a one-to-one correspondence among the memory cells with redundancy, the decoder circuits, the read amplifiers and the output pads.

In addition, according to another aspect of the present invention, the judgment means comprises the output switching circuits number of that is equivalent to that of the memory cell blocks, and one element such as an inverter for controlling the output switching circuits. Thus, the area required for the layout of the device can be reduced, and the control of the device can be made easier.

According to another aspect of the present invention, the junction capacity of the output pads can be made smaller. In addition, as the read data which is read at the normal reading operation can be directly output to the output pad, the data can be output at higher speed.

The entire disclosure of Japanese Patent Application No. 10-319587 filed on Nov. 10, 1998 including specification, claims, drawings and summary is incorporated herein by reference in its entirety.

What is claimed is:

1. A semiconductor memory device comprising:

n sets of memory cell blocks (n is a positive integer);

n sets of decoder circuits provided so as to correspond to said memory cell blocks that carry out the redundant operation, and that output a decoder signal at a first level when the redundant function is not in operation, but output a decoder signal at a second level when the redundant function is in operation;

a judgment means which detects if the redundant function is in operation; wherein the judgment means outputs a first level judgment signal when all the decoder signals are at the first level, but outputs a second level judgment signal when any of the decoder signals is at the second level.

2. A semiconductor memory device as claimed in claim 1, wherein said judgment means includes n−1 sets of judgment circuits connected in series, and each judgment circuit comprises an NAND element and an inverter, input of which is connected to the output of said NAND element.

3. A semiconductor memory device as claimed in claim 2, wherein at least said decoder signal corresponding to the $i^{th}$ memory cell block (i is an integer from 1 to n−2, while n is an integer more than 3) and an output signal from the inverter provided in the $i+1^{th}$ judgment circuit are input to the NAND element in the $i^{th}$ judgment circuit, and wherein said decoder signal corresponding to the $n-1^{th}$ memory cell block and said decoder signal corresponding to the $n^{th}$ memory cell block are input to the NAND element in the $n-1^{th}$ judgment circuit.

4. A semiconductor memory device as claimed in claim 2, wherein said output signal from the inverter in said judgment circuit which is positioned at the upstream of one of the judgment circuits at least by two or more stages is input to at least one NAND element in said judgment circuit.

5. A semiconductor memory device, comprising:

n sets of memory cell blocks (n is a positive integer);

n sets of decoder circuits provided so as to correspond to said memory cell blocks that carry out the redundant operation, and that output a decoder signal at a first level to below mentioned judgment means when the redundant function is in operation, but output a decoder signal at a second level when the redundant function is not in operation;

n sets of read out means provided so as to correspond to said memory cell blocks for reading out data from said memory cell block;

a judgment means which detects if the redundant function is in operation, comprising n sets of output switching circuits wherein said $i^{th}$ output switching circuit (i is an integer from 1 to n) switches back and forth between the data read out by the $i^{th}$ read out means and said $i^{th}$ decoder signal, and outputs the switched data or signal.

6. A semiconductor memory device as claimed in claim 5, wherein said judgment means comprises n sets of output switching circuit connected in series.

7. A semiconductor memory device as claimed in claim 5, wherein said output switching circuit includes two transfer gates and switches back and forth between said transfer gates with the first transfer gate to which the data read out by the $i^{th}$ read out means is input, and the second transfer gate to which $i^{th}$ decoder signal is input.

8. A semiconductor memory device as claimed in claim 5, wherein said output switching circuit includes a latch means for switching back and forth between the data read out by said $i^{th}$ read out means and said $i^{th}$ decoder signal and latching the switched signal or data.

* * * * *